July 28, 1959 L. P. HUNTER 2,897,105

FORMATION OF P-N JUNCTIONS

Filed April 19, 1952

INVENTOR
LLOYD P. HUNTER
BY
Joseph C. Sweet, Jr.
ATTORNEY 2,897,105
Patented July 28, 1959

2,897,105

FORMATION OF P–N JUNCTIONS

Lloyd P. Hunter, Poughkeepsie, N.Y., assignor to International Business Machines Corporation, New York, N.Y., a corporation of New York Application April 19, 1952, Serial No. 283,222

9 Claims. (Cl. 148—1.5)

This invention relates to the formation of P–N junctions and more particularly to methods of forming P–N junctions in semi-conductors.

As is now well known in the art, semi-conductor diodes and transistors (including triodes, tetrodes, pentodes, etc.) have many uses in the field of electronics and in many applications are preferred over their thermionic or vacuum tube counterparts. Initially these semi-conductor devices comprised a small block of semi-conductor material to one surface of which was applied one or more point contact or rectifying electrodes. Later it was discovered that two or more layers of alternately N- and P-type semi-conductor material might be utilized, together with contacts of the ohmic type, one for and connected to each layer. See for example, Shockley et al., "P–N Junction Transistors," Physical Review, vol. 83, pp. 161–162, July 1, 1951. As there is pointed out, in N-conductivity type semi-conductor material the charges normally available for carrying current are negative, i.e., electrons, whereas in P-conductivity type semi-conductor material the charges normally available for carrying current are positive, i.e., "holes."

Known methods of forming P–N junctions in semi-conductors have certain disadvantages. One method, which may be termed the diffusion method, involves the placement of a quantity of P- or N-type impurity element in physical contact with the opposite sides of a thin wafer of N- or P-type semi-conductor, respectively, of the proper resistivity value and then heating the mass to a temperature sufficient to cause the impurity to diffuse into the interior of the wafer. This heating is terminated just before the center layer of the wafer is converted from its original conductivity type to that of the impurity. One marked disadvantage of this method is the lack of independent control of the resistivity of the two regions converted by the impurity. Another is the relatively wide boundaries or junctions between the regions of different conductivity type.

Another method, which may be termed the "pulling" method, involves initially making contact between one end of a seed crystal and a melt of the same semi-conductor material, maintaining a thermal gradient in the apparatus so that the melting point is at the contacted surface and slowly withdrawing the seed crystal so that the meniscus freezes as it rises from the melt. This method, used primarily for growing single crystals, may also be used to create P–N junctions by changing the conductivity type of the melt at intervals as the seed crystal is withdrawn. See Teal et al., "Growth of Germanium Single Crystals Containing P–N Junctions," Physical Review, vol. 81, page 637, February 15, 1951. Disadvantages of this method include (1) the degree of mechanical stability of the melt required to insure success is very great, and the slightest vibration transmitted to the relatively large mass of the melt may cause imperfect junctions, (2) the required thermal gradient is extremely difficult to maintain since as the process continues, the level of the melt changes and necessitates an adjustment in position of the thermal gradient, and (3) the rate of withdrawal of the crystal must be carefully controlled and adjusted to compensate for the continually increasing amount of heat abstracted from the melt through the growing crystal.

Accordingly, the principal feature of this invention is the provision of new methods of forming P–N junctions in semi-conductors which do not have these disadvantages, which methods are characterized by placing abutting bodies of the same semi-conductor material but of opposite conductivity types in an atmosphere which is non-contaminating and non-reacting with the semi-conductor material and applying heat to at least one body to raise it to the melting point of the semi-conductor material.

Other features of this invention will be pointed out in the following description and claims and illustrated in the accompanying drawings, which disclosed by way of example the principle of this invention and the best mode which has been contemplated of applying that principle.

Figure 2A:
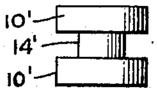
Fig. 2 illustrates in schematic form and partially in cross section an alternative method of forming P–N junctions in semi-conductors in accordance with this invention.
Figure 2:
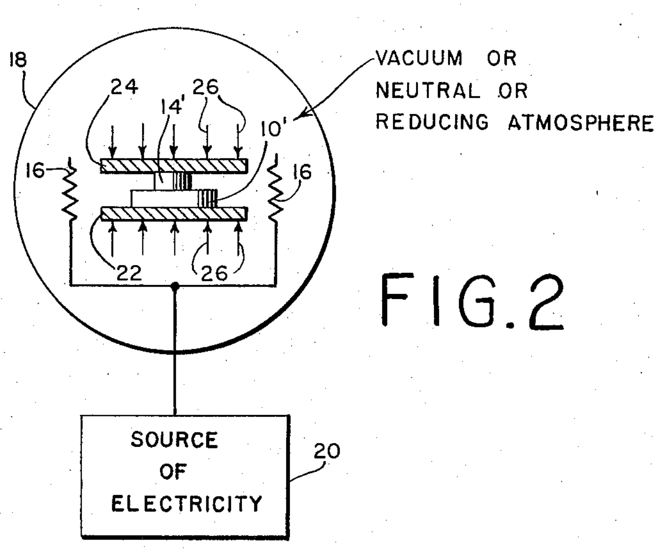
Figure 2B:
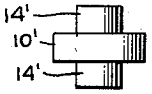
Figure 2C:
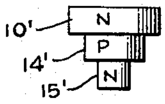
Figure 3:
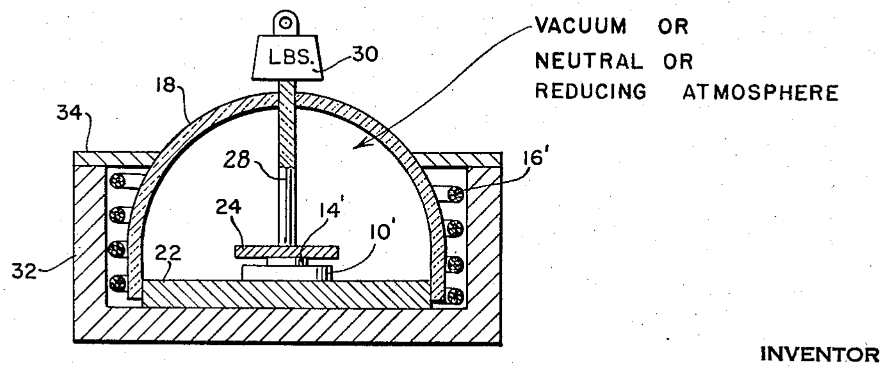

Figs. 2*a*–2*c* each illustrate semi-conductor bodies incorporating two P–N junctions in accordance with this invention; and, Fig. 3 illustrates, partially in cross section, apparatus for carrying out the method illustrated somewhat more schematically in Fig. 2.

Figure 1:
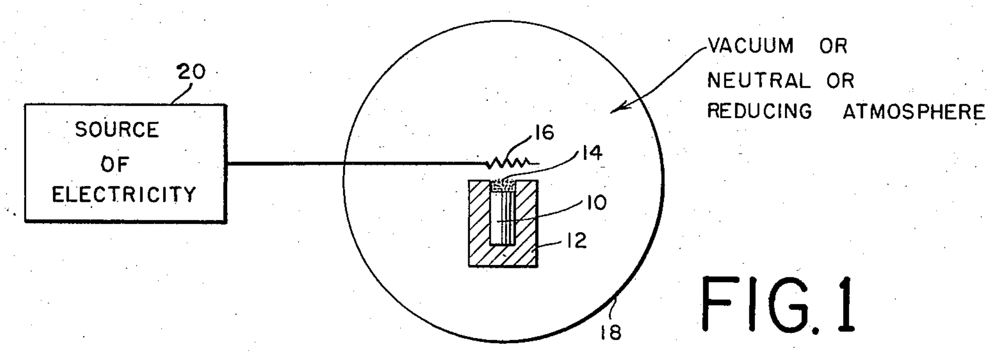
Fig. 1 illustrates in schematic form and partially in cross section one method of forming P–N junctions in semi-conductors in accordance with this invention.

Referring now to Fig. 1, a body of semi-conductor material of either N- or P-type conductivity in the form of a small rod 10 is placed in a pure graphite crucible 12. By way of example, this rod may be of N-type germanium approximately one square millimeter in cross section and of a length such that the top of rod 10 remains about 1/32 of an inch below the top of the crucible. Crucible 12 is now filled with reduced semi-conductor material 14 of the opposite conductivity type, e.g., germanium metal powder containing the appropriate amount of P-conductivity type impurity. A radiant heater 16 is then placed immediately above the crucible as shown, this heater also being formed of pure graphite in order that neither it nor the crucible will introduce objectionable impurities into the semi-conductor material. The apparatus thus far described is surrounded by an atmosphere envelope 18, which may, for example, be of quartz, and the space within envelope 18 then made non-contaminating and non-reacting as regards the semi-conductor material. This may be accomplished either by evacuation to produce a vacuum or by filling the envelope with a neutral or reducing atmosphere, e.g. purified helium or hydrogen, respectively.

Radiant heater 16 is fed from an external source of electricity 20 and the temperature of the upper surface of the melt and the crucible 12 raised to the melting point of the germanium powder, approximately 946° C. Since heat is applied only from above as shown, there will be a steep thermal gradient in both the material and the crucible. It is, therefore, possible to maintain the temperature corresponding to the melting point of the semi-conductor material throughout the powder and at the upper surface of the N-type germanium rod 10, while the remainder of rod 10 is maintained below the melting point of the semi-conductor material. After powder 14 has been completely melted, the temperature is slowly lowered until the crystal structure of the original germanium rod 10 extends itself through the new P-type region formed from powder 14, and the whole mass then becomes a single crystal. During this cooling process, the temperature may be reduced initially at a reasonably rapid rate, e.g. 10° per minute, until a temperature of 550° C. is reached. The mass should then be maintained at this temperature for approximately sixteen hours before it is allowed to cool further.

If added junctions are desired, i.e., to form an N–P–N or a P–N–P block or body, the process above described may be repeated with powder of the desired conductivity type placed against the desired surface of opposite conductivity type of the body and the melting and freezing or cooling process above described repeated. It is, of course, obvious that this process may be repeated as many times as desired to produce not only a semi-conductor diode or triode body, but also bodies for tetrodes, pentodes, etc.

While the above example has been given in terms of a rod of N-type germanium material and powder of P-type germanium material, if desired the rod may be of P-conductivity type germanium and the powder of N-conductivity type germanium. Also the powder may be replaced by a solid body. Further, the method is not limited to any specific semi-conductor material, although only one semi-conductor material may be used at a time. For example, silicon may be utilized instead of germanium and P–N junctions formed therein in the same manner, although higher temperatures are then required in view of the higher melting point of silicon.

In Fig. 2 is illustrated schematically an alternative method of forming P–N junctions in semi-conductors which expand on freezing, e.g. germanium. Similar elements in all figures are designated by the same reference numerals or by corresponding primed reference numerals. The major difference between the methods of Figs. 1 and 2 is that in Fig 2 pressure is applied to both bodies (of the same semi-conductor material but of opposite conductivity types) during the formation of the P–N junction as described hereinafter. Again, the description of the method of Fig. 2 will be given in terms of N- and P-conductivity type germanium. However, other semi-conductor materials which expand upon freezing may be utilized. For example, silicon is another semi-conductor material which expands upon freezing. See pages 383 and 384 of the article by Scaff, Theuerer, and Schumacher entitled "P-Type and N-Type Silicon and the Formation of the Photovoltaic Barrier in Silicon Ingots" appearing in Transactions of the American Institute of Metallurgical and Mining Engineers, Metals Section, volume 185, June 1949. As is well known, and set forth in the classical Clapeyron equation, the melting point of a material which expands upon freezing (or contracts upon melting) may be reduced by the application of pressure. See, for example, pages 284–286 of the treatise entitled "Heat and Thermodynamics," by Zemansky, second edition, McGraw-Hill (New York, 1943).

As shown in Fig. 2, two wafers 10′ and 14′ of germanium of opposite conductivity types are pressed together between two opposed members 22 and 24 as indicated by the force arrows 26. Members 22 and 24 are again made of pure graphite in order to prevent any undesired impurities from contaminating or reacting with the germanium. One wafer 14′ is of constant cross sectional area and is smaller than the other wafer 10′ so that the surface area of wafer 14′ abutting the opposed surface of the larger wafer 10′ is smaller than that surface area of the latter.

The ratio of the areas will depend upon the accuracy of the ambient temperature control. For example, if the ambient temperature can only be controlled to ±2° C., it is essential to have at least 5° C. difference in the melting points of the two wafers for a constant applied force. This differential in melting points may be obtained either by varying the applied force, the ratio of the cross sectional areas, the absolute areas, or any combination of these since the lowering of the melting point is directly proportional to the applied pressure.

Referring again to Fig. 2, as before a pure graphite radiant heater 16 is provided to heat the semi-conductor material, and the apparatus thus far described is enclosed in atmosphere envelope 18, which again is either evacuated or filled with a neutral or reducing atmosphere. An external source of electricity 20 is again connected to electric radiant heater 16, which is illustrated schematically as comprising two elements but may conveniently be in the form of a circular coil surrounding the wafers 10′ and 14′.

Since the lower surface area of wafer 14′ is smaller than the abutting upper surface area of wafer 10′ as described above, it is possible, when pressure is applied to press wafers 10′ and 14′ together to melt wafer 14′ at a temperature below that at which wafer 10′ will melt. This is accomplished by applying a constant force to the members 22 and 24 as indicated by the force arrows 26 and slowly raising the ambient temperature of the apparatus toward the normal melting point of the semi-conductor material being processed. When the melting point of wafer 14′ is reached corresponding to the pressure thereon, wafer 14′ and the immediately adjacent surface of wafer 10′ fuse, thus increasing the abutting surface areas of wafers 10′ and 14′ under the action of the steadily applied force. If the temperature is raised no further, the system comes to equilibrium and the materials freeze as the cross sectional area of the abutting surface of wafers 10′ and 14′ increases until the constant applied force is no longer sufficient to maintain the material molten for the temperature maintained by radiant heater 16, which temperature is less than the normal melting point for the semi-conductor material.

The depth of penetration of the melted region in wafer 10′ is limited under these conditions since the pressure drops off rapidly going from wafer 14′ across the interface into wafer 10′. Since wafer 14′ is of uniform cross sectional area and represents the smallest cross sectional area in the system, a uniform pressure will exist throughout wafer 14′ and it will therefore melt throughout at the same temperature.

Two or more P–N junctions may be formed simultaneously in accordance with this second method by providing pairs of large wafers 10′ of one conductivity type and sandwiching a small wafer 14′ of opposite conductivity type between each pair of wafers 10′, as shown in Fig. 2*a*. Thus two wafers 10′ and one wafer 14′ would produce a P–N–P or N–P–N body, depending upon whether wafer 14′ was of N- or P-type material respectively. Also a large wafer 10′ may be sandwiched between two smaller wafers 14′ of equal cross section, as shown in Fig. 2*b* to again produce the highest and equal pressure at each abutment between wafer 10′ and a wafer 14. Alternatively, a single P–N junction may be formed as described above and the process then repeated as many times as desired by pressing, each time, an additional wafer of the proper conductivity type against the desired wafer of the opposite conductivity type, this additional wafer each time being of smaller cross sectional area than the abutting surface of the wafer against which it is pressed. For example, if a third N-type germanium wafer 15′ were pressed against P-type germanium wafer 14′, its cross sectional area should be smaller than the abutting surface of the latter, and an N–P–N body or block would result, as shown in Fig. 2*c*.

It is believed that if this alternative process for forming two or more P–N junctions is carried out, together with a very slow freezing following a forming of each P–N junction, that the P–N boundaries are produced in a single crystal structure, whereas if a plurality of P–N junctions are produced simultaneously as first described by sandwiching layers of three or more wafers, crystal boundaries coincident with the P–N junctions are produced.

In Fig. 3, which is not to scale for the sake of clarity, is shown in somewhat more detail apparatus for carrying out the method of Fig. 2. Pressure member 22 is shown in the form of a graphite base plate sealed to atmosphere envelope 18, which may for example be of quartz. Larger wafer 10′, which again may for example be of N-conductivity type germanium, is placed atop base plate 22 and smaller wafer 14′, which would then be of P-conductivity type germanium, is sandwiched between wafer 10′ and the second graphite pressure member 24. A quartz pressure rod 28 extends through atmosphere envelope 18 and at its lower end abuts pressure member 24. Atop its other end may be placed a suitable weight or weights 30 to produce the desired pressure at the abutting opposed surfaces of wafers 10′ and 14′. In order to produce this pressure there must, of course, be a slidable seal between atmosphere envelope 18 and either base member 22 or rod 28, or else atmosphere envelope 18 must be able to be flexed sufficiently to allow the desired pressure to be exerted between pressure members 22 and 24. A pot furnace 32 partially surrounds the structure thus far described and is heated by heating elements 16′, which no longer need be of graphite since they are now positioned outside atmosphere envelope 18. The conventional source of electricity for heating element 16′ is not shown in this figure. As indicated, pot furnace 32 extends far enough above the plane of the abutting opposed surfaces of wafers 10′ and 14′ so that the desired carefully-controlled constant temperature may be maintained thereat. An apertured cover 34 for pot furnace 32 may be provided as shown to assist in maintaining this desired temperature.

By way of example, atmosphere envelope 18 may be evacuated to provide a vacuum, and wafer 10′ may be 0.002 square inch in cross section and wafer 14′ approximately 0.001 square inch in cross section. A weight 30 of six lbs. then produces approximately 6,000 p.s.i. pressure at the abutting opposed surfaces of wafers 10′ and 14′. At this pressure the normal melting point of germanium is reduced approximately 5°, i.e., from 946° C. to 941° C. Thus the difference in melting point of wafers 10′ and 14′ is 2.5°, inasmuch as their cross sectional areas are in the ratio 2:1. If then the temperature of wafers 10′ and 14′ is raised to approximately 941°, wafer 14′ will melt and then solidify as both its surface area and cross sectional area increase. The wafers 10′ and 14′ may then be cooled fairly rapidly, e.g., 10° C. per minute, to 550° C. and then maintained at that temperature for approximately sixteen hours before they are further cooled.

A variation of this second method of Figs. 2 and 3 for the formation of P–N junctions in semi-conductors which expand on freezing is obtained by utilizing two wafers 10′ and 14′ of the same cross section but of which at least one is of reduced cross sectional area at their abutment. The greatest reduction in melting point of the semi-conductor material thus again occurs only in the material immediately adjacent this abutment.

In accordance with this invention, methods have been disclosed for forming P–N junctions in semi-conductors which allow the independent control of the resistivity value of the various P- and N-regions of the final crystal, which do not require great mechanical stability, and which do not require extremely involved temperature control as in the "pulling" method.

While there have been shown and described and pointed out the fundamental novel feature of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. The method of making junction-type transistors by joining first and second semiconductor specimens of one conductivity type with a third semiconductor specimen of the other conductivity type, said method comprising the steps of stressing the first and second semiconductor specimens against the third semiconductor specimen at opposite surfaces of the third semiconductor specimen, and heating the specimens to a value of temperature whereat the first and second specimens coalesce with the third specimen only at the respective opposite surfaces of the third specimen.

2. The method of making junction-type transistors by joining first and second semiconductor specimens of one conductivity type with a third semiconductor specimen of the other conductivity type, said method comprising the steps of sandwiching the third specimen between said first and second specimens with substantially equal pressures, and progressively raising the temperature of said specimens until local melting of the specimens occurs at the contacting interfaces therebetween.

3. A method of forming P–N junctions in semi-conductors which expand on freezing comprising the steps of placing a body of P-conductivity type semi-conductor material which expands on freezing abutting a body of the same semi-conductor material of N-conductivity type in a non-contaminating atmosphere non-reacting with the semi-conductor material, at least one of said bodies being of reduced cross sectional area at their abutment, applying pressure to the bodies to press them together, said pressure being sufficient to reduce the normal melting point of the semi-conductor material, and applying heat to the bodies to raise their temperature only to the melting point of the material immediately adjacent their abutment for the particular pressure applied.

4. A method of forming P–N junctions in semi-conductors which expand on freezing comprising the steps of placing a body of P-conductivity type semi-conductor material which expands on freezing abutting a body of the same semi-conductor material of N-conductivity type in a neutral atmosphere, the surface area of one body at the abutment being less than the surface area of the abutting surface of the other, applying pressure to the bodies to press them together, said pressure being sufficient to reduce the normal melting point of the semi-conductor material, and applying heat to the bodies to raise their temperature only to the melting point of the material immediately adjacent the smaller surface area at the abutment for the particular pressure applied.

5. A method of forming P–N junctions in semi-conductors which expand on freezing comprising the steps of placing a body of P-conductivity type semi-conductor material which expands on freezing abutting a body of the same semi-conductor material of N-conductivity type in a reducing atmosphere, the surface area of one body at the abutment being less than the surface area of the abutting surface of the other, applying pressure to the bodies to press them together, said pressure being sufficient to reduce the normal melting point of the semi-conductor material, and applying heat to the bodies to raise their temperature only to the melting point of the material immediately adjacent the smaller surface area at the abutment for the particular pressure applied.

6. A method of forming P–N junctions in semi-conductors which expand on freezing comprising the steps of placing a body of P-conductivity type semi-conductor material which expands on freezing abutting a body of the same semi-conductor material of N-conductivity type in a vacuum, the surface area of one body at the abutment being less than the surface area of the abutting surface of the other, applying pressure to the bodies to press them together, said pressure being sufficient to reduce the normal melting point of the semi-conductor material, and applying heat to the bodies to raise their temperatures only to the melting point of the material immediately adjacent the smaller surface area at the abutment for the particular pressure applied.

7. A method of forming P–N junctions in semi-conductors which expand on freezing comprising the steps of placing a first body of constant cross sectional area and of P-conductivity type semi-conductor material which expands on freezing between and abutting opposed surfaces of second and third semi-conductor bodies of the same semi-conductor material of N-conductivity type in a non-contaminating atmosphere non-reacting with the semi-conductor material, the surface area of the first body at each abutment being less than the surface area of the abutting surface of the respective N-conductivity type body, applying pressure to the bodies to press them together along the abutting surfaces, said pressure being sufficient to reduce the normal melting point of the semi-conductor material, and applying heat to the bodies to raise their temperature only to the melting point of the material immediately adjacent the smaller surface areas at the abutments for the particular pressure applied.

8. A method of forming P–N junctions in semi-conductors which expand on freezing comprising the steps of placing a first body of constant cross sectional area and of N-conductivity type semi-conductor material which expands on freezing between and abutting opposed surfaces of second and third bodies of the same semi-conductor material of P-conductivity type in a non-contaminating atmosphere non-reacting with the semi-conductor material, the surface area of the first body at each abutment being less than the surface area of the abutting surface of the respective P-conductivity type body, applying pressure to the bodies to press them together along the abutting surfaces, said pressure being sufficient to reduce the normal melting point of the semi-conductor material, and applying heat to the bodies to raise their temperature only to the melting point of the material immediately adjacent the smaller surface areas at the abutments for the particular pressure applied.

9. A method of forming P–N germanium junctions comprising the steps of placing a body of P-conductivity type germanium abutting a body of N-conductivity type germanium in a vacuum, the surface area of one body at the abutment being less than the surface area of the abutting surface of the other, applying pressure to the bodies to press them together with a pressure of approximately 6,000 p.s.i. at their abutting surfaces, said pressure being sufficient to reduce the normal melting point of germanium by 5° C., heating the bodies to a temperature approximately 5° C. below the normal melting point of germanium to melt only the germanium immediately adjacent the smaller surface area at the abutment, maintaining that temperature until the germanium immediately adjacent the smaller surface area at the abutment resolidifies after melting, thereupon reducing the temperature to 550° C., and maintaining that lower temperature for a period of approximately sixteen hours before further cooling the bodies.

References Cited in the file of this patent

UNITED STATES PATENTS

| | | |
|---|---|---|
| 2,053,216 | Deming | Sept. 1, 1936 |
| 2,083,395 | Pfalzgraff | June 8, 1937 |
| 2,231,027 | Renner | Feb. 11, 1941 |
| 2,343,771 | Holmquist | Mar. 7, 1944 |
| 2,356,338 | Misfeldt | Aug. 22, 1944 |
| 2,449,484 | Jaffe | Sept. 14, 1948 |
| 2,560,594 | Pearson | July 17, 1951 |
| 2,589,658 | Bardeen | Mar. 18, 1952 |
| 2,623,102 | Shockley | Dec. 23, 1952 |
| 2,644,852 | Dunlap | July 7, 1953 |
| 2,701,326 | Pfann | Feb. 1, 1955 |

OTHER REFERENCES

Stroup: Metal Progress, January 1950, pages 59 and 61.

Shulman: Journal of Applied Physics, 1953, vol. 24, page 224.

Ser. No. 292,740, Bernstorff (A.P.C.), published July 13, 1943.